(12) United States Patent
Larsen et al.

(10) Patent No.: US 10,549,480 B2
(45) Date of Patent: Feb. 4, 2020

(54) ULTRASONIC WELDING OF A MICROFLUIDIC DEVICE

(71) Applicant: KONINKLIJKE PHILIPS N.V., Eindhoven (NL)

(72) Inventors: Niels Agersnap Larsen, Nivaa (DK); Klaus Mogensen, Allerød (DK)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 16/348,553

(22) PCT Filed: Nov. 17, 2017

(86) PCT No.: PCT/EP2017/079686
§ 371 (c)(1),
(2) Date: May 9, 2019

(87) PCT Pub. No.: WO2018/095829
PCT Pub. Date: May 31, 2018

(65) Prior Publication Data
US 2019/0270255 A1    Sep. 5, 2019

(30) Foreign Application Priority Data
Nov. 23, 2016    (EP) .................................. 16200250

(51) Int. Cl.
*B32B 37/00*    (2006.01)
*B29C 65/08*    (2006.01)
(Continued)

(52) U.S. Cl.
CPC ........ *B29C 65/08* (2013.01); *B01L 3/502707* (2013.01); *B29C 66/3022* (2013.01); *B01L 2300/0887* (2013.01); *B29L 2031/756* (2013.01)

(58) Field of Classification Search
CPC ................. B29C 65/08; B29C 66/3022; B01L 3/502707; B81C 3/00
(Continued)

(56) References Cited

U.S. PATENT DOCUMENTS 6,066,216 A     5/2000  Ruppel
7,419,639 B2 *  9/2008  Osterfeld .......... B01L 3/502707
                                                          422/50
(Continued)

FOREIGN PATENT DOCUMENTS

CN    101088912 A    12/2007
CN    104960195 A    10/2015
(Continued)

OTHER PUBLICATIONS

Kistrup, K. et al, "Ultrasonic welding for fast bonding of self-aligned structures in Lab-on-a-chip systems". LAB CHIP, 2015, vol. 15, pp. 1998-2001.
(Continued)

*Primary Examiner* — James D Sells (57) ABSTRACT

The invention is about an ultrasonic welding-based microfluidic device. It is mainly made of a first element and a second element welded one to the other via at least one structure (10, 10'). The structure (10, 10') comprises an elongated welded portion for said welding, a welding channel (12, 12') extending between the first and second elements and along one side of the welded portion, and a draining channel (13) communicating with the welding channel (12, 12') and the microfluidic path (20, 20') of the device. The invention is further about a method of manufacturing such a device.

17 Claims, 5 Drawing Sheets

(51) Int. Cl.
  *B29C 65/00* (2006.01)
  *B01L 3/00* (2006.01)
  *B29L 31/00* (2006.01)

(58) Field of Classification Search
  USPC .................................................. 156/73.1
  See application file for complete search history.

(56) References Cited

U.S. PATENT DOCUMENTS

| | | | |
|---|---|---|---|
| 9,592,501 B2 * | 3/2017 | Jarvius | .............. B01L 3/502707 |
| 2009/0152326 A1 | 6/2009 | Shin | |

FOREIGN PATENT DOCUMENTS

| | | |
|---|---|---|
| CN | 105109034 A | 12/2015 |
| JP | 2005224688 A | 8/2005 |
| JP | 2007283677 A | 11/2007 |
| JP | 2008006724 A | 1/2008 |
| JP | 2009095800 A | 5/2009 |
| WO | 199935497 A2 | 7/1999 |

OTHER PUBLICATIONS

International Search Report and Written Opinion, PCT/EP2017/079686, dated Mar. 7, 2018.

* cited by examiner

ULTRASONIC WELDING OF A MICROFLUIDIC DEVICE

CROSS-REFERENCE TO PRIOR APPLICATIONS

This application is the U.S. National Phase application under 35 U.S.C. § 371 of International Application No. PCT/EP2017/079686, filed on Nov. 17, 2017, which claims the benefit of European Patent Application No. 16200250.5 filed on Nov. 23, 2016. These applications are hereby incorporated by reference herein.

FIELD OF THE INVENTION

The present invention relates to an ultrasonic welding-based microfluidic device and a method of manufacturing the same.

These types of devices may be used as disposables to receive a fluid (e.g. a biological sample) for analysis purpose. Typically, such disposables may be designed to be inserted in analyzers.

BACKGROUND OF THE INVENTION

Ultrasonic welding is used to assembly a top element (e.g. a board, a foil, a base part, a substrate, etc.) to a bottom element (e.g. a board, a foil, a base part, a substrate, etc.) in order to manufacture a microfluidic device, closing then the microfluidic grooves and cavities made on one and/or the other main surface of said first and second elements to form then microfluidic channels and chambers of a microfluidic path. The welding is performed at junction points involving plastic and/or metal materials.

In an industrial environment, ultrasonic welding typically implies the use of energy directors provided on said top or on said bottom elements. Then they are melt for welding purpose by applying simultaneously ultrasonic energy and mechanical pressure for a short time, creating said junction points and the sealing of the top and bottom elements.

It is important that the microfluidics path(s) in the device, usually containing dried or wet reagents or chemistry or coating to be provided during manufacturing of the device, have geometry, dimensions and positions that accurately match with the predetermined design specification of the device, in an industrially reproducible manner. It is in particular key that the welding does not change the design of the microfluidics or does not lead to an inaccuracy due to low tolerances of the welding.

In order to address these requirements, US2009152326 discloses the use of welding stoppers having a certain height and provided on a bottom board, and of energy directors provided on a top board. Once bottom and top boards are assembled in view of the welding for providing the microfluidic device, some gaps separate each energy director from adjacent welding stoppers forming then some welding channels on either side of the energy directors. The melted materials provided from the ultrasonically melting of the tips of the energy directors then flow into these welding channels, and not between the energy directors and the bottom board which would have otherwise created an extra thickness between the two, affecting the weld depth and a good positioning of the bottom and top boards. Furthermore said welding stoppers prevent the top board not to descend anymore when the top and bottom boards are assembled before the welding step, which may further increase the positioning accuracy of the two boards before welding.

Similarly U.S. Pat. No. 6,066,216 discloses the use of welding stoppers and energy directors, separated to each other by welding grooves to receive the melted material, but both welding stoppers and energy directors being provided on the bottom board.

SUMMARY OF THE INVENTION

A purpose of the invention is an improvement of the manufacturing process of the microfluidic device in order to increase the tolerances. In particular if this manufacturing involves the applying of a reagent liquid on one or the other of said two elements before assembling and welding, it is contemplated that this liquid does not disturb the welding.

Another purpose of the invention is the provision an ultrasonic welding-based microfluidic device arranged to be filled with a sample fluid in its integrated microfluidic network, without any loss of sample fluid at the welded locations.

Another purpose of the invention is to provide an ultrasonic welding-based microfluidic device arranged to be an universal device, i.e. which can be used with different types of fluid sample to be filled in its microfluidic path and which can accommodate different volumes of samples to be filled in the device in use, for an optimized analysis of this sample.

At least some of these purposes are achieved by providing, according to a first embodiment of the invention, an ultrasonic welding-based device comprising a microfluidic path for a fluid, the device being mainly made of a first element and a second element welded one to the other via at least one structure, said structure comprising:
an elongated central portion providing said welding, resulting from the melting of an initial energy director when using ultrasound welding,
a welding channel extending between the first and second elements and along one side of the central portion, and
a draining channel communicating with the welding channel and said microfluidic path.

The melted materials provided from the ultrasonically melting of the tip of the energy director flow into the welding channel during manufacturing, and not between the energy director and the other element (first or second one) which would have otherwise created an extra thickness between the two, affecting a weld depth and creating thus some wrong positioning or unwanted gap between the first and the second elements. This welding channel allows therefore to keep a vertical geometry after welding and a high tolerance.

As an option the initial energy director(s) can be provided on the first and/or on the second bottom elements.

Said draining channel may allow the draining or a flowing out from the welding channel to the microfluidic path of any liquids that may have been received in the welding channel. Such liquids may have been employed in a step of manufacturing the microfluidic device, before the assembling or welding of the first and second elements. For example, this manufacturing step can comprise the provision of a reagent liquid or a coating onto the first element in order to treat a surface of the microfluidic path (e.g. to change some physical or chemical properties of this surface), or to deposit some reagents in this path so as to be mixed thereafter with the fluid sample when the device is in use (e.g. the reagents may be provided with specifically bonds to some analytes present in the sample for detection purpose of analytes in the sample, or be lysing agents to lyse cells in the sample). Such a liquid reagent or coating may then be at least partly dried before or after welding. Alternatively they may stay in a liquid state.

This reagent or coating may be deposited from evaporation of liquid solutions in some appropriate locations of the microfluidic path of the first element, before the second element is assembled with it. But due to the lack of full control of this deposition step, it is likely that a part of this reagent is deposited in the welding channel too, which will then serve accordingly as unwanted reservoirs for this chemistry if not drained off via the draining channel of the invention to the microfluidic path. Therefore the draining channel prevents that any reagent (or other liquid) in the welding channel takes up volume that is needed for the welded material that flows in the welding channel when the energy director is melt during the ultrasonic welding (as aforementioned), and prevents therefore that there is not enough space in the welding channel to host the welded material. If no draining channel, there is therefore a risk that this welded material goes beyond the edge of the welding channel, creating accordingly a gap after welding between the first and second elements or an internal pressure in the device at the welding location leading to a structural weakness of the device. This gap or internal pressure may be particularly harmful if the second element is a flexible element (e.g. a foil, a thin laminate or a membrane) which can be easily deformed due to a welding of a bad quality, leading to tightness issues in the device and/or anesthetic aspect of it. The consequence can be even worse in the event that the large excess of liquid in the welding channel is smeared over the surface during welding. The reason for this is that the welding structure of the energy director (typically of triangular shape) melts during welding and presses the adjacent liquid to the sides, when the welding structure is flown down. This results in an uncontrolled redistribution of liquid (which may include chemistry as aforementioned) as well as an uncontrolled welding process.

A main function of the draining channel of the invention allows then the reagents or any other undesired liquid to be drained off from the welding channel to the microfluidic path which it communicates with.

Optionally, the ultrasonic welding-based device may comprise a second welding channel extending between the first and second elements and along the opposite side of the welded central portion (or energy director before welding).

The second welding channel may be useful to store the welded material coming from the melting of the energy director during the ultrasonic welding, allowing therefore the device to host the welded material on the right and on the left of the welded energy director, in respectively the first and second welding channels.

This second welding channel may communicate with said draining channel.

By this way, any liquid used in the manufacturing process of the device may be drained off from the second welding channel via this draining channel too. This embodiment may be convenient because the same draining channel is used for both draining the first and second welding channels, which leads to a simpler and stronger design of the device.

Alternatively, the second welding channel may communicate via a second draining channel to the microfluidic path.

Such a second draining channel may have the similar aforementioned functionality as the first one. This second draining channel may be particularly interesting if it communicates with a part of the microfluidic path different from another part of the microfluidic channel which the first draining channel communicates with. This may be interesting to spread by this way the liquids stored in the two welding channels over different locations of the microfluidic path. This embodiment can be also interesting because the cross-section of each one of first and second draining channels may be decreased, with respect to a design with a single draining channel for the first and second welding channels. And smaller draining channels may exhibit a higher flow resistance of the fluid sample which will flow in the microfluidic path, and prevent it to enter into the welding channels. This second draining channel may have a further advantage in case the liquid to be received in the second welding channel is different from the liquid received in the first welding channel, allowing therefore to direct the first liquid (in the first welding channel) to a first location of the microfluidic path where this first liquid must be received and the second liquid (in the second welding channel) to a second location of the microfluidic path where this second liquid must be received. For example, this first liquid may be a coating of an anti-biofouling material to be provided on a first surface of the microfluidic path and the second liquid contains antibodies, nucleic acids, or other materials to be bonded to biomarkers/analytes present in the sample.

Alternatively, said second draining channel may communicate with the first welding channel too (further to the second welding channel) such that the liquid present in the first welding channel can be evacuated to the microfluidic path via the second draining channel too. This can be interesting if a mixing of the two liquids (the one in the first welding channel and the one in the second welding channel) leads to a mixed liquid useful for the manufacturing process. Similarly, the first draining channel may communicate with the second welding channel too (further to the first welding channel) such that the first and second welding channels can communicate with the microfluidic path both through the first draining channel and through the second draining channel. This design may be particularly interesting if the first draining channel communicates with a part of the microfluidic path different and if the second draining channel communicates with another part of the microfluidic path. This may be interesting to thus spread the liquids stored in the two welding channels over different locations of the microfluidic path. This embodiment can be also interesting because the cross-section of each one of first and second draining channels may be decreased, with respect to a design with a single draining channel for the first and second welding channels, and exhibit then a higher flow resistance of the liquid sample which will flow in the microfluidic path (thus preventing it to enter into the welding channels).

In a particular aspect of this embodiment, the first and second welding channels can directly communicate to each other and surround the welded portion (or the energy director). One or two or more than two draining channel(s) may communicate with this surrounded channel and with the microfluidic path (e.g. with one or two or more channels and/or chambers of the microfluidic path).

In a second embodiment of the invention, it is provided an ultrasonic welding-based device provided with a microfluidic path for a liquid, the device being mainly made of a first element and a second element welded one to the other via at least one array of welded junctions adjacent to each other and separated one to the other by respective walls. Each one of said welded junctions in the array of welded junctions comprises a welded portion providing said welding and resulting from the melting of an initial energy director when using ultrasound welding.

This array of welded junctions may be equivalent to a single larger welded junction resulting from the melting of a single initial large energy director when using ultrasound welding, by replacing this single large junction by a plurality of small and adjacent junctions. In a preferable case, the size of the junctions in the array is indeed much smaller than the one of the equivalent large junction. This may have the advantage to spread more homogeneously the melting and the heat (produced by the supply of the ultrasonic energy) over a junction area than in the case of a single large junction. This may have some importance especially in case the second element to weld is easily deformable or is heat-sensitive (e.g. if it is a foil, a membrane, or made of a heat-sensitive material). Furthermore, the risk of finding some melted material between the first and the second elements decreases too, which may increase the tolerances of the welding.

Optionally, at least one of these junctions in said array comprises:
- an elongated welded portion providing said welding and resulting from the melting of an initial energy director when using ultrasound welding,
- one (or two) side(s) channel(s) extending between the first and second elements and along one side (or the two sides) of the welded portion.

The melted materials provided from the ultrasonically melting of the tip of the energy director then flowed into the welding channel, and not between the energy director and the other element (first or second one) which would have otherwise created an extra thickness between the two, affecting a weld depth and creating thus some bad positioning or an unwanted gap between the first and the second elements. This welding channel allows therefore keeping a vertical geometry after welding and a high tolerance.

Optionally, a plurality or all of the junctions are provided with said welding channel(s).

Optionally, at least one of these junctions in said array comprises said structure, i.e.:
- an elongated welded portion providing said welding, resulting from the melting of an initial energy director when using ultrasound welding,
- a welding channel extending between the first and second elements and along one side of the welded portion, and
- a draining channel communicating with the welding channel and said microfluidic path.

All the aforementioned options and improvements of the structure according to the first embodiment of the invention can be applicable to this array of junctions too.

Optionally, a plurality or all of the junctions are said structures according to the first embodiment of the invention.

By providing such an array of smaller energy directors (or welded portions)/welding channels used in combination with said draining channels, the cross-sections of both the welding channels and the draining channels are drastically decreased too. This has a consequence that the flow resistance of fluid potentially entrant into the draining channels and welding channels is increased. This may be of particular interest when a fluid sample is introduced into the microfluidic path of the device (in use), then it will mostly not enter the welding channel (contrary to a single larger welded junctions with a single large welding channel and a large draining channel)—such microfluidic path communicating with the welding channels via the draining channels. Moreover, this can prevent trapping of air bubbles during fluid filling. It is to be noticed that this is obtained while maintaining the same overall welding area.

In a further option to said first or second embodiment, the ultrasonic welding-based device is further arranged such that, in use, the microfluidic path is to be filled with a fluid (e.g. a liquid sample such as for instance a biological sample), that the fluid flows mainly in the microfluidic path into a determined flowing direction in proximity with the connection with said at least one draining channel, and wherein this at least one draining channel extends mostly perpendicular to this flowing direction.

By providing such a design, a capillary stop may be formed at the entrance of said draining channels, preventing the entrance of said fluid into the welding channels. Since the volume of fluid that would have entered into the welding channels via the draining channels is useless, this optional design avoids such loss of fluid and thus that the microfluidic path is preferentially filled. Furthermore, introduction of the fluid sample into the welding channels may have an undesired aesthetical or anti-marketing effect, especially if the device is mostly transparent (e.g. if the device is used with an optical analyzer) and the fluid sample has a visible color (e.g. blood).

Alternatively, or in combination, the device may be further arranged in such a way that the fluid resistance in the draining channel is higher than in the microfluidic path, at the location where the draining channel communicates with the microfluidic path such that a fluid filled in the microfluidic path flows preferentially into the microfluidic path. That could be provided for instance in said structure with hydrophobic, oleophobic or omniphobic property (depending on the hydrophilicity, oleophilicity or omniphilicity property of the fluid to be flown in the device). More particularly, at least one structure comprises surfaces provided with nano-scale or micro-scale structure elements enhancing the hydrophobic, oleophobic or omniphobic property of these surfaces. Such structure elements may for example be small pillars or small peaks. As an option the surfaces of the welding channels and/or the draining channels may further be provided with structure which helps the expelling of any liquid stored in the welding channels before welding (as aforementioned).

As a third embodiment, the invention is about an ultrasonic welding-based device provided with a microfluidic path for a fluid, the device being mainly made of a first element and a second element welded one to the other via at least one welded junction resulting from the melting of an initial energy director when using ultrasound welding, wherein the microfluidic path comprises two fluidic channels, each one delimited by two longitudinal side walls, each channel having different heights, and wherein the welded junction is located between the two side walls. It may have an elongated shape extending between these two side walls.

These heights may be chosen to accommodate different volumes or heights of fluid to be filled in the device in use. In particular if the fluid is blood (or plasma or serum) and the device comprises a chamber or channel optically transparent for optical analysis of blood (or plasma or serum), these different heights may be determined to optimize the optical detection of certain cells in blood. For example, the best height may change depending on the coagulation status of the blood, and/or whether one wants to detect erythrocytes, thrombocytes or white blood cells. Accordingly, an appropriate height of channel can be selected among the different channels present in the device, and/or the sensitivity of the analysis may be optimized accordingly.

This device may thus be used as a universal device, disposable or cartridge.

According to an option, some welding channels may be provided along one or the two side(s) of the welded junction (i.e. energy director before welding).

According to another option of this third embodiment, the welded portion is replaced by a structure according to the first embodiment or a welded junction according to the second embodiment.

According to a further embodiment, the invention proposes a method of manufacturing a microfluidic device from a first element and a second element to be welded one to the other, comprising:
(a) forming said first element;
(b) forming said second element;
(c) assembling the first and the second elements; and
(d) ultrasonically welding the first with the second elements;

wherein step (a) and/or (b) comprises the forming on a main face of the first and/or second elements (respectively) of at least one elongated energy director;

wherein step (a) comprises the forming, on a main face of the first element, of microfluidic cavities to provide at least a part of a microfluidic path for a fluid (i.e. liquid and/or gas) once the first and second elements are welded one to the other; and wherein step (d) comprises applying an ultrasonic energy to the energy director(s) to perform the welding at the energy director(s).

Without any restriction of the invention, height of said energy director may be included in the rough range of 1 to 200 µm with a length typically between 1 mm (or lower) to several cm.

Without any restriction of the invention, height of said microcavities may be between 1 µm roughly to around 1 mm with a length in the range of 100 µm (or lower) to several cm.

Optionally, said step (a) further comprises the forming, on a main face of the first element of at least one welding groove such that corresponding welding channel(s) extend(s) between the first and second elements and that said at least one welding channel further extends along one side of the energy director, once the first and second elements are assembled in step (c).

Without any restriction of the invention, height of said welding groove(s) may be between 1 µm roughly to around 1 mm with a length in the range of 100 µm (or lower) to several cm.

As a particular option, said step (a) further comprises the forming, on a main face of the first element, of at least one draining groove or tunnel communicating with at least one welding groove such that the draining channel communicates with the microfluidic path, once the first and second elements are assembled in step (c).

Without any restriction of the invention, height of said draining groove(s) may be between 1 µm roughly to around 1 mm with a length in the range 100 µm (or lower) to 500 µm (or lower).

As a particular option, step (a) and/or (b) comprises the forming on a main face of the first and/or second elements (respectively) of at least one array of energy directors adjacent to each other and separated one to the other by respective walls, step (d) comprising applying an ultrasonic energy to the energy director(s) to perform the welding at the energy director(s). Optionally, a mechanical pressure is further exerted on the second and/or first elements, simultaneously to applying ultrasonic energy.

The initial energy director(s) can be initially provided on the first and/or on the second elements.

Optionally, the energy director(s) is (are) initially provided on the first element only. By this way, the invention provides all (or most of) the microfluidic patterns (i.e. microfluidic grooves, energy directors, welding grooves if any, draining grooves if any, etc.) on the first element such that the second element can be simplified, in particular may exhibit no microfluidic pattern (it may be for instance a simple flat board or a foil): therefore no specific mold for this second element and no corresponding molding step in the manufacturing process are needed. Furthermore, positioning accuracy of any microfluidic patterns of the second element with microfluidic patterns of the first element can be avoided too in the manufacturing process. Therefore, the provision of the energy directors on the first element only leads to a lower costs and quicker manufacturing process.

In still another option of the manufacturing process of the device, some bonding surfaces are provided on the first element as welding stoppers, to prevent the second element of the device not to descend anymore when the second and first elements are assembled in step (c). Positioning of first and second elements of the device is therefore accurate and the microfluidic path then tightly closed. Those bonding surfaces may be provided by surfaces surrounding said microfluidic cavities, welding grooves if any, draining grooves if any, extending over the same flat plane. Only the energy directors in the first element (if they are provided in this first element) would be higher than those surfaces to anticipate their decrease in height during the melting when ultrasound energy is applied.

According to a further embodiment, the invention proposes a base part to be ultrasonically welded to a top part for making a device having an integrated microfluidic path of a fluid, said base part comprising cavities for the microfluidic path and a structure comprising:
an elongated energy director arranged to be partly melted when applying appropriate ultrasound energy for said welding purpose,
a welding groove extending along one side of the energy director, and a draining groove communicating with the welding groove and said microfluidic cavities.

BRIEF DESCRIPTION OF THE DRAWINGS

These and other aspects of the invention will be apparent from and elucidated with reference to the embodiment(s) described hereinafter. In the following.

DETAILED DESCRIPTION OF THE INVENTION

Figure 1:
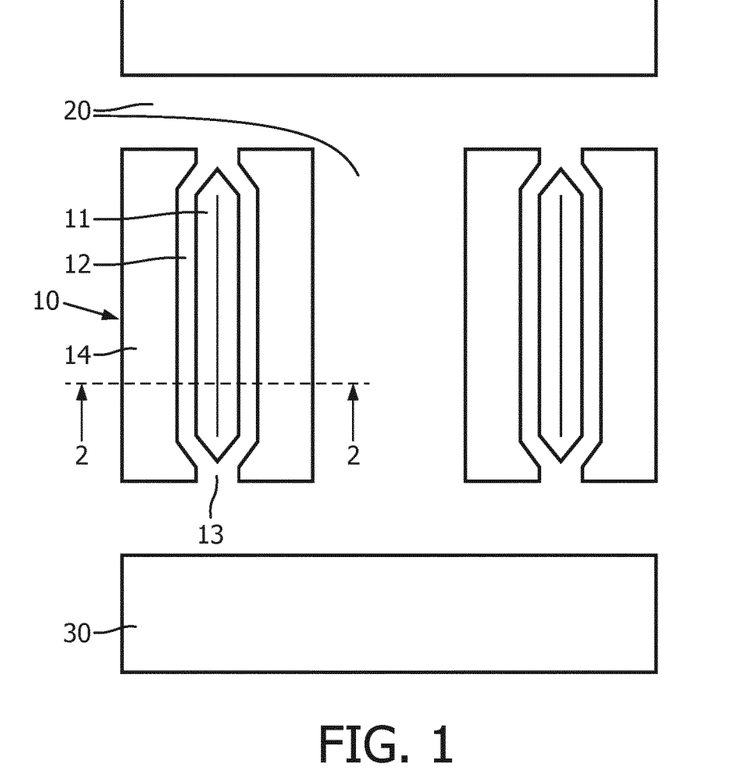
FIG. 1 shows a schematic top view of a portion of a base part of a microfluidic device of the invention.

FIG. 1 shows a portion of a base part of an ultrasonic welding-based device. This base part is to be assembled with a top part (not shown in this Figure) and to be welded to the latter via ultrasonic welding.

This base part comprises a microfluidic grooves and cavities comprising in this example main grooves 20 (in this example, the main grooves 20 comprise two parallel channels and an intermediary channel communicating with these two parallel channels). It is arranged to receive a fluid, once the top part of the device is sealed or welded to his base part. This fluid may be for instance a liquid sample to be filled in the finalized device for analysis purpose.

Once sealed together, the base part and the top part forms a microfluidic device integrating an integrated microfluidic path comprising said microfluidic grooves and cavities (including said main grooves 20). Such final device may be a disposable or a cartridge. This disposable or cartridge may be designed to be inserted in an analyzing instrument to analyze a fluid sample introduced in the device.

Figure 3:
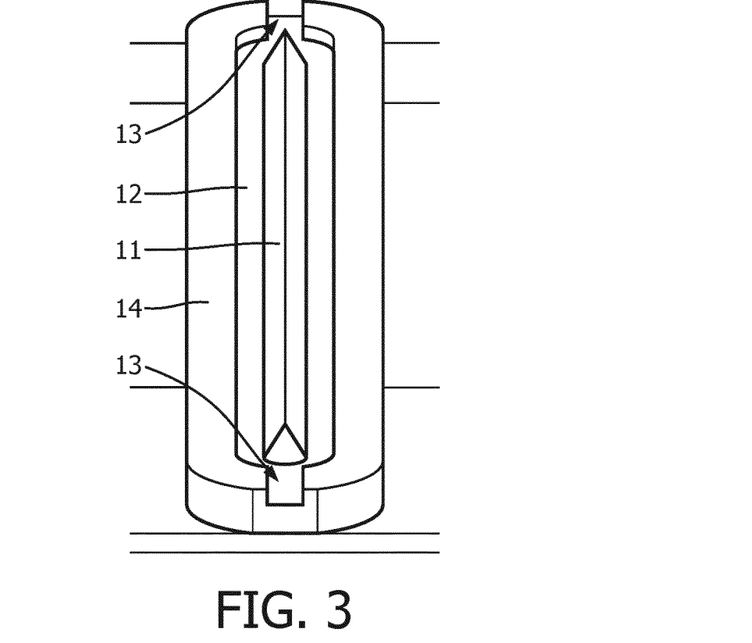
FIG. 3 shows a perspective view of the element of the device depicted in FIG. 2.

One main surface of this base part further comprises two structures 10, each one (as depicted in FIG. 3) comprising:
- an elongated energy director 11 to provide said welding by melting its tip when using appropriate ultrasonic energy,
- two welding grooves 12 extending along either sides of the energy director 11, and
- two draining grooves 13 communicating with the welding grooves 12 and said main channels 20.

The base part may be made mainly into a plastic or polymeric material.

The welding grooves 12 and the draining grooves 13 can be incorporated into the existing device mold, so no additional process steps or costs are needed.

It may be integrally molded or micromilling, casting, embossing with the appropriate shape and size.

Figure 2:
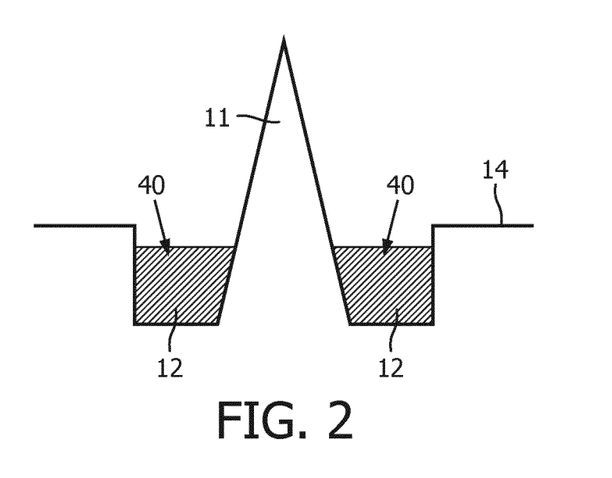
FIG. 2 shows a schematic cross-section view according to a cut along the 2-2 plane of the base part of FIG. 1.

The base part can be assembled and then welded to said top part, thanks to an ultrasonic welding at the tip of the energy directors 10 (the tip being typically of pyramidal or triangular shape)—see FIG. 2—which is melt to perform this welding. As an example, the top part of the device may be a substrate, a membrane, a foil, a film, etc. It may be made at least partly in plastic or polymeric material, especially at the welding locations. The ultrasonic energy may be brought during a short time, as a pulse as well-known in the art. Furthermore, a mechanical pressure may be exerted simultaneously to the application of this energy such that the welding between the base part and the top part is effective, strong and tight with high tolerance.

After welding, the top part (welded to the base part) tightly closes or seals all these grooves 20, 12, as well as the draining channels 13 to the extent the latter have not been provided as tunnels provided through respective walls separating the welding grooves 12 and the main grooves 20. Thus, after welding, the main grooves 20 become main channels, welding grooves 12 become welding channels and draining grooves 13 become draining channels. This tight closing is provided thanks to bonding surfaces 14-30 of the base part which extend over a main planar surface. These bonding surfaces act as welding stoppers since they prevent the top part of the device not to descend anymore when the top and base parts are assembled before the welding step. Positioning of the base and top parts of the device is therefore accurate and the microfluidic path 20 can then be tightly closed.

Furthermore, it is to be noticed that all the microfluidic patterns (i.e. microfluidic grooves 20, energy directors 11, welding grooves 12, draining grooves 13, etc.) are provided on the base part only such that the top part (not shown) can be simplified, in particular the latter may exhibit no microfluidic pattern (it may consist for instance of a simple flat board or a foil): therefore no specific mold for the top part and no corresponding molding step in the manufacturing process are needed. Furthermore, positioning accuracy of any microfluidic pattern of the top part with microfluidic patterns of the base part is needless too in the manufacturing process. As a consequence, the provision of the energy directors on the base part leads to a lower costs and quicker manufacturing process.

Nevertheless, in a very specific applications, at least a part of these bonding surfaces 14-30 may not extend over the same plane: this can be useful either to provide gaps between the base part and the top part for microfluidic purpose and/or because the top part is flexible and then its shape can be adapted to the pattern of the non-planar bonding surfaces 14 or 30.

Figure 4:
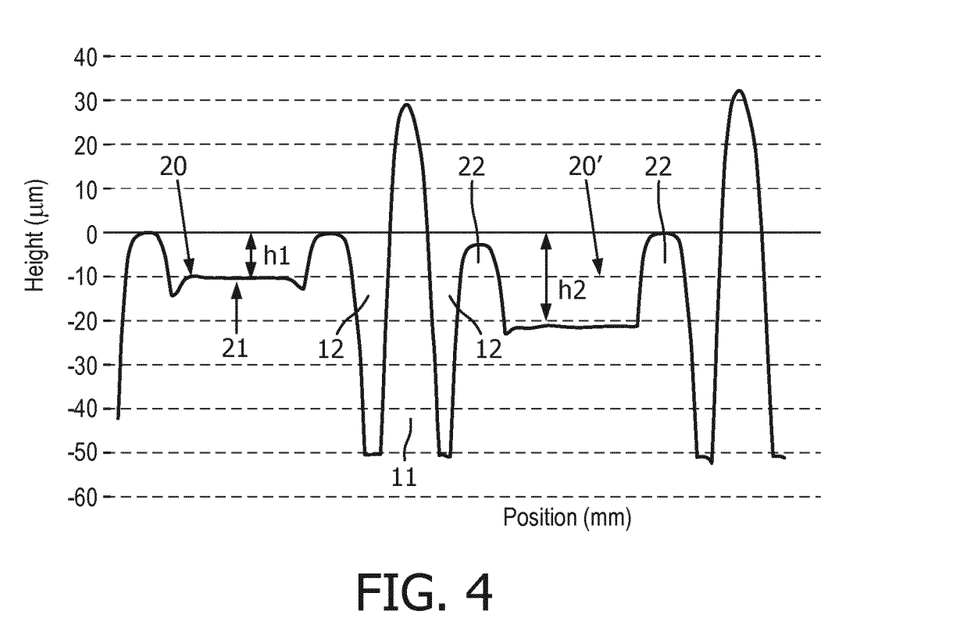
FIG. 4 shows a schematic cross-section view of a portion of a microfluidic device.

In a specific case, shown in FIG. 4, the base part comprises two fluidic grooves 20 and 20' of the microfluidic path, each one delimited by one floor 21 and two longitudinal side walls 22. The two fluidic grooves 20 and 20' have different heights h1 and h2 respectively. The energy director 11 is located between the two fluidic channels 20-20', welding grooves 12 separating the side walls 22 from the energy director 11. Draining channel 13 (not shown here) may be further provided to expel some chemistry or liquid from the welding channels (as already explained).

These heights h1 and h2 may be chosen to accommodate different volumes or heights of fluid to be filled in the device in use. In particular if the fluid is blood (or plasma or serum) and the device comprises a chamber or channel optically transparent for performing an optical analysis of blood (or plasma or serum), these different heights may be determined to optimize the optical detection of certain cells in blood. For example, the best height may change depending on the coagulation status of the blood, and/or whether one wants to detect erythrocytes, thrombocytes or white blood cells. Accordingly, an appropriate height of channel can be selected among the different channels present in the device, and the sensitivity of the analysis may be optimize accordingly. For example h1 may be around 10 µm and h2 around 20 µm.

FIG. 2 shows how a liquid 40 (used for instance in the manufacturing process of the device) may be stored in the welding channels 12, and how this liquid may hamper the melted material (coming the melting of the tip of the energy director 10) to flow down to the welding channels 12. The draining groove 13 ensures then that this liquid (which may comprise chemistry) deposited over the base part or the structure 10, and not preferentially dried in the welding grooves 12, can flow out of the welding grooves 12 and into the outer channels 20 during drying of the chemistry, as seen in FIGS. 1 and 3.

Figure 7:
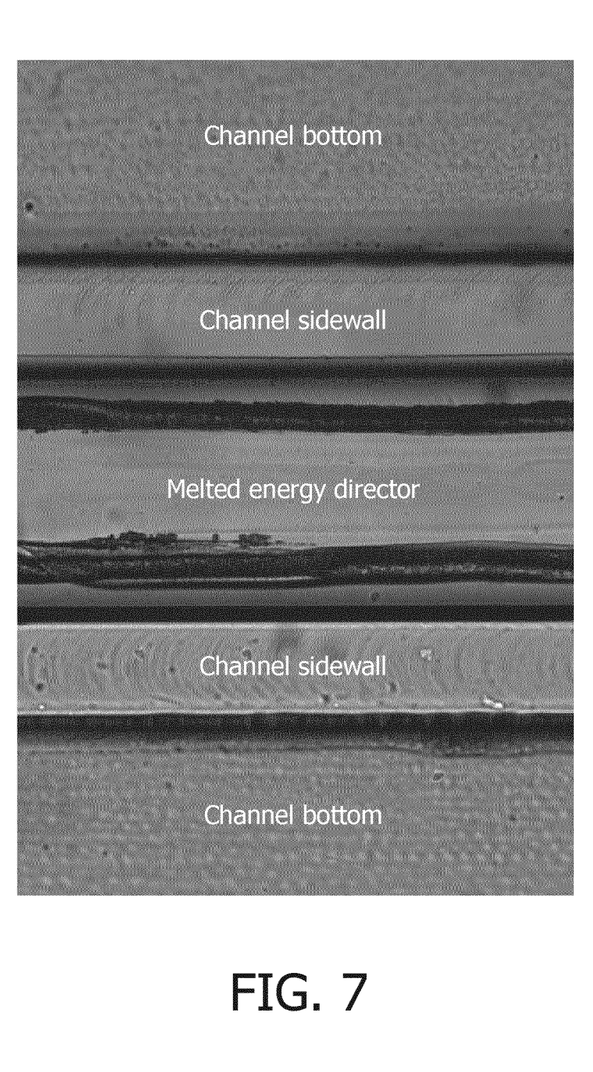
FIG. 7 shows a first photograph of an ultrasonically welded junction according to the invention, taken by an optical microscope.
Figure 8:
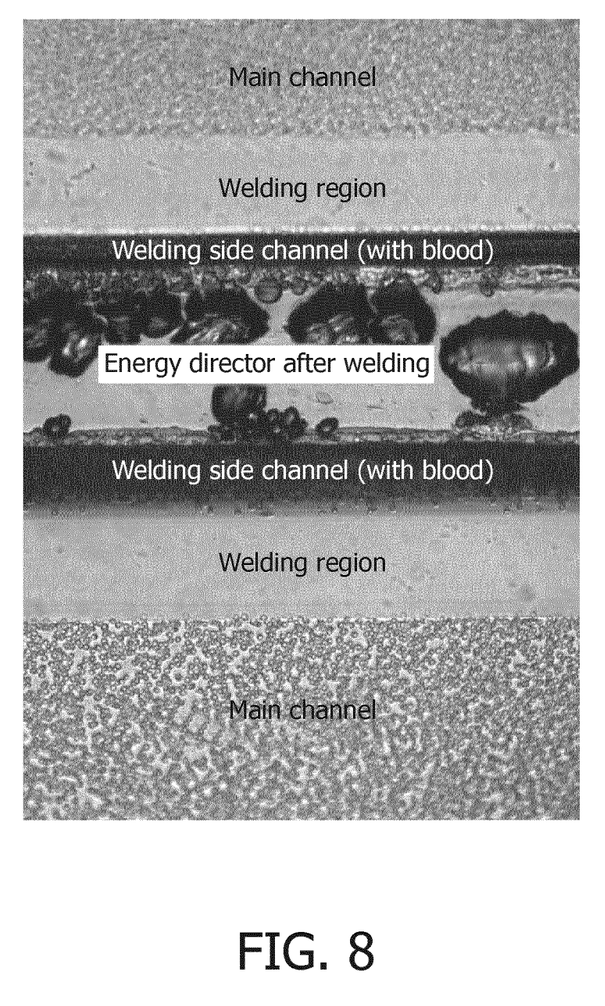
FIG. 8 shows a second photograph of an ultrasonically welded junction according to the invention, taken by an optical microscope.

Examples of an implementation (i.e. after welding) is shown in the microscope images of FIGS. 7 and 8 (after welding of a top film). Here, the melted energy director located within the welding groove is seen.

Figure 5:
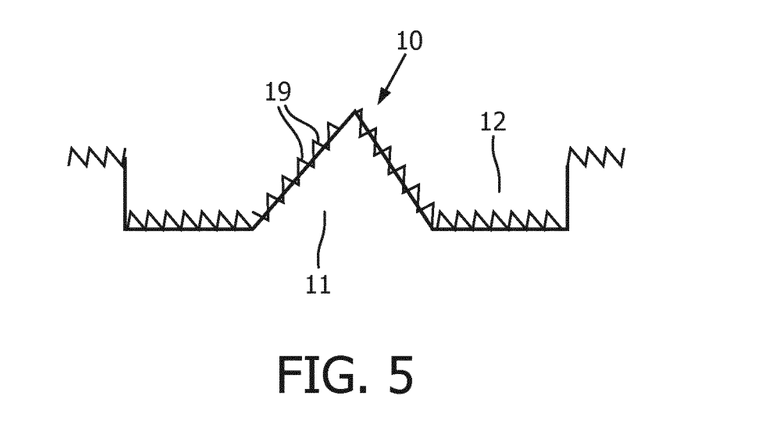
FIG. 5 shows a schematic cross-section view of a portion of a junction structure of a microfluidic device.

According to a further embodiment of the invention, as depicted in FIG. 5, some nano-scale or micro-scale structure elements 19 are provided on some surfaces of the structure 10 in such a way that the fluid resistance in the draining channel 13 or in the welding channel 12 is higher than in the microfluidic path 20, in particular at the location where the draining channel communicates with the microfluidic path 20 such that a fluid filled in the microfluidic path 20 flows preferentially into the microfluidic path 20. These structure elements 19 are arranged indeed such that they enhance the hydrophobic, oleophobic or omniphobic property of these surfaces on which they have been formed. Such structure elements 19 may for example be small pillars or small peaks.

The size of the small pillars or small peaks may be in the range of 10 nm to 1 µm roughly.

The structure elements 19 can be arranged repeatedly or randomized with a structure-to-structure separation similar to their size.

These structure elements 19 may be useful to address the potential issue consisting in the fluid (introduced in the device to fill at least a part of the microfluidic path 20) flowing along the energy directors 11 during filling, which may disturb the filling process and take up a certain fluid volume. A compromised filling may also be found by appropriately dimensioning small channels, such as channels with a height below 10 µm, because in this case the filling time of the main channel will be slow due to its high flow resistance.

Preferably, the surface elements 19 are arranged so as to:

expel the deposited chemical reagents 40 from the welding grooves 12 towards the main channels 20, and to decrease detrimental fluid flow along the welding grooves 12.

Figure 6:
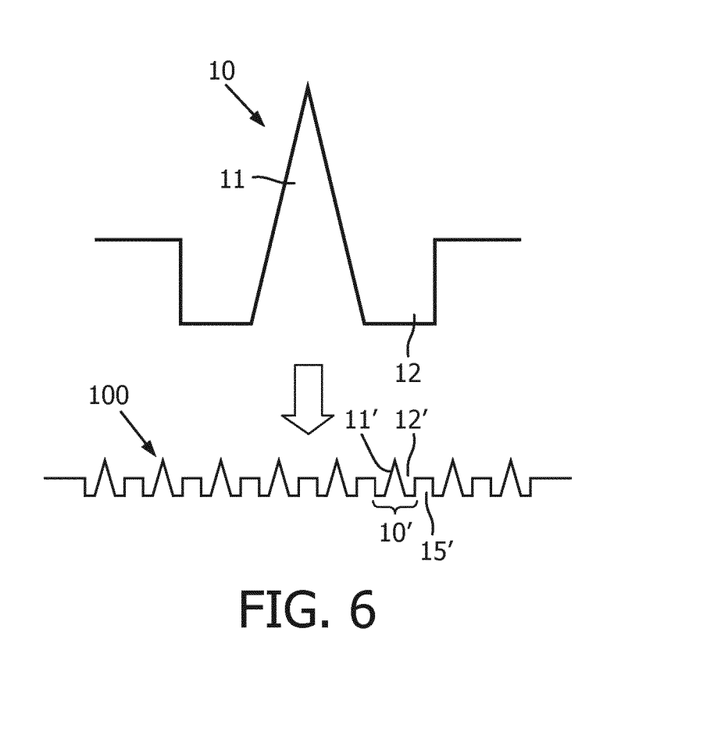
FIG. 6 shows two schematic cross-section views of, respectively, two different junction structures of a microfluidic device: a first one comprising a single large energy director, and a second one comprising an array of small energy directors, with a similar junction area between the two.

In a further embodiment of the invention, depicted by FIG. 6, the single structure 10 (of FIGS. 1-3) is replaced by an array 100 of structures 10' adjacent to each other and separated one to the other by respective walls 15'. Each one of said structures 10' comprises an energy director 11', welding grooves 12' and optionally at least one draining channel as aforedescribed (not shown). Preferably the height and general size of each energy director 11' and of each welding channel 12' of each structure 10' are much smaller than the size of the large energy director 11 and side wall 12 of the single structure 10 (top drawing of FIG. 6). Typically, the welding grooves 12' height is lower than 50 µm, preferably lower than 20 µm, lower than 10 µm. Accordingly the ultrasonic welding force from the melting of each energy director 11' will be much smaller than the one of the large energy director 11, but the addition of these welding forces may be equivalent to the one of the large energy director 11. Additionally, and preferably, the welding area used for the large structure 10 may be equivalent or similar to the one of the array 100 to reach a similar welding area.

The use of this array 100 may have some importance to increase the tolerances of the welding.

Furthermore, such an array 100 of smaller cross-sections of both the welding channels 12' and the draining channels increases the flow resistance of liquid potentially entrant into the draining channels and welding channels 12'. This may be of particular interest when a liquid sample is introduced into the microfluidic path 20 of the device (in use), then it will mostly not enter the welding channel 12' (contrary to a single larger welded junctions with a single large welding channel and a large draining channel)—such microfluidic path communicating with the welding channels 12' via the draining channels. This can also prevent entrapment of air bubbles.

Said structure elements 19 may further be used in the array 100 to increase the flow resistance.

According to a further embodiment, the invention proposes a method of manufacturing a microfluidic device from a first element and a second element to be welded one to the other, comprising:

(a) forming said first element—e.g. by molding or any other known technique (e.g. micromilling, embossing, casting);

(b) forming said second element—e.g. by molding or any other known technique (e.g. micromilling, embossing, casting);

(c) assembling the first and the second elements; and (d) ultrasonically welding the first with the second elements;

wherein step (a) and/or (b) comprises the forming on a main face of the first and/or second elements (respectively) of at least one elongated energy director;

wherein step (a) comprises the forming, on a main face of the first element of:

microfluidic cavities to provide at least a part of a microfluidic path for a fluid once the first and second elements are welded one to the other; and of at least one welding groove, and a draining groove communicating with at least one welding groove, such that:

corresponding welding channel(s) extend(s) between the first and second elements, that said at least one welding channel further extends along one side of the energy director, and that the draining channel communicates with the microfluidic path, once the first and second elements are assembled in step (c); and wherein step (d) comprises applying an ultrasonic energy to the energy director(s) to perform the welding at the energy director(s).

In a particular option, the method further comprises, between steps (a) and (c), provision of a liquid (containing e.g. a reagent or a coating chemistry) on the first element, such that the liquid is present into the microfluidic path before the first and second elements are welded one to the other, and optionally a further step of drying this liquid is implemented before or after step (d).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

The invention claimed is:

1. An ultrasonic welding-based device provided with a microfluidic path for a fluid, the device being mainly made of a first element and a second element welded one to the other via at least one structure, said structure comprising:

an elongated welded portion providing said welding, resulting from the melting of an initial energy director when using ultrasound welding, a welding channel extending between the first and second elements and along one side of the welded portion, and a draining channel communicating with the welding channel and said microfluidic path.

2. Ultrasonic welding-based device of claim 1, wherein said structure comprising a second welding channel extending between the first and second elements and along the opposite side of the elongated welded portion.

3. Ultrasonic welding-based device of claim 2, wherein said draining channel further communicates with said second welding channel.

4. Ultrasonic welding-based device of claim 2, wherein said structure further comprises a second draining channel communicating with said second welding channel and said microfluidic path.

5. Ultrasonic welding-based device of claim 4, wherein said second draining channel further communicates with said welding channel.

6. Ultrasonic welding-based device of claim 5, wherein said draining channel further communicates with said second welding channel.

7. Ultrasonic welding-based device of claim 1, comprising an array of welded junctions adjacent to each other and separated one to the other by respective walls, each one of said welded junctions in the array comprising a welded portion providing a welding and resulting from the melting of an initial energy director when using ultrasound welding, wherein the array comprises at least one of said structure.

8. Ultrasonic welding-based device of claim 7, wherein the array of welded junctions comprising at least two of said structures having the same draining channel(s).

9. Ultrasonic welding-based device of claim 7, wherein the height of the wall(s) determine(s) the height of the welding channels.

10. Ultrasonic welding-based device of claim 1, wherein this device is arranged such that, when the device is in use, the fluid flows mainly in the microfluidic path into a determined flowing direction in proximity with the connection with said at least one draining channel, and wherein this at least one draining channel extends mostly perpendicular to this flowing direction.

11. Ultrasonic welding-based device of claim 1, further arranged in such a way that the fluid resistance in the draining channel is higher than in the microfluidic path, at the location where the draining channel communicates with the microfluidic path such that a fluid filled in the microfluidic path goes preferentially to the microfluidic path at this location.

12. Ultrasonic welding-based device of claim 1, wherein at least one structure comprises surfaces having hydrophobic, oleophobic or omniphobic property.

13. Ultrasonic welding-based device of claim 1, wherein at least one structure comprises surfaces provided with nano-scale or micro-scale structure elements enhancing the hydrophobic, oleophobic or omniphobic property of these surfaces.

14. Ultrasonic welding-based device of claim 13, wherein the first element is a foil or a laminate.

15. A method of manufacturing a microfluidic device from a first element and a second element to be welded one to the other, comprising:
 (a) forming said first element;
 (b) forming said second element;
 (c) assembling the first and the second elements; and
 (d) ultrasonically welding the first with the second elements;

wherein step (a) and/or (b) comprises the forming on a main face of the first and/or second elements (respectively) of at least one elongated energy director;

wherein step (a) comprises the forming, on a main face of the first element of:
 microfluidic cavities to provide at least a part of a microfluidic path for a fluid once the first and second elements are welded one to the other; and of
 at least one welding groove, and a draining channel or groove communicating with at least one welding groove, such that:
  corresponding welding channel(s) extend(s) between the first and second elements, that
  said at least one welding groove further extends along one side of the energy director, and that
  the draining channel or groove communicates with some microfluidic cavities,
 once the first and second elements are assembled in step (c); and wherein step (d) comprises applying an ultrasonic energy to the energy director(s) to perform the welding at the energy director(s).

16. Method of claim 15, further comprising, between steps (a) and (c), provision of a liquid on the first element, such that the liquid is present into the microfluidic path before the first and second elements are welded one to the other, and optionally a further step of drying this liquid is implemented before or after step (d).

17. A base part to be ultrasonically welded to a top part for making a device provided with integrated microfluidic path of a fluid, said base part comprising cavities for the microfluidic path and a structure comprising:
 an elongated energy director arranged to be partly melted when applying appropriate ultrasound energy for said welding purpose,
 a welding groove extending along one side of the energy director, and
 a draining groove communicating with the welding groove and said microfluidic cavities.

* * * * *